United States Patent
Liu et al.

(10) Patent No.: US 8,270,270 B2
(45) Date of Patent: Sep. 18, 2012

(54) METHODS FOR ON-LINE CALIBRATING OUTPUT POWER OF OPTICAL PICK-UP

(75) Inventors: Yao Wen Liu, Hsinchu (TW); Chung Yi Wang, Hsinchu (TW)

(73) Assignee: Sunplus Technology Co., Ltd., Hsin-Chu (TW)

( * ) Notice: Subject to any disclaimer, the term of this patent is extended or adjusted under 35 U.S.C. 154(b) by 152 days.

(21) Appl. No.: 12/502,458

(22) Filed: Jul. 14, 2009

(65) Prior Publication Data

US 2010/0177314 A1 Jul. 15, 2010

(30) Foreign Application Priority Data

Jan. 9, 2009 (TW) .............................. 98100563 A

(51) Int. Cl.
*G11B 27/36* (2006.01)

(52) U.S. Cl. ................... 369/47.5; 369/47.53; 369/53.26

(58) Field of Classification Search ........................ None
See application file for complete search history.

(56) References Cited

U.S. PATENT DOCUMENTS

| | | | | |
|---|---|---|---|---|
| 4,785,443 A | * | 11/1988 | Minami et al. ................. | 369/116 |
| 5,008,888 A | * | 4/1991 | Numata et al. ............ | 372/29.014 |
| 5,067,122 A | * | 11/1991 | McGee ........................ | 369/116 |
| 5,070,495 A | * | 12/1991 | Bletscher et al. ........... | 369/47.52 |
| 5,136,569 A | * | 8/1992 | Fennema et al. ............ | 369/53.23 |
| 5,172,365 A | * | 12/1992 | Call et al. ....................... | 369/116 |
| 5,175,722 A | * | 12/1992 | Minami et al. ................. | 369/116 |
| 5,185,734 A | * | 2/1993 | Call et al. ....................... | 369/116 |
| 5,197,059 A | * | 3/1993 | Minami et al. ................. | 369/116 |
| 5,216,659 A | * | 6/1993 | Call et al. ....................... | 369/116 |
| 5,231,625 A | * | 7/1993 | Hokozono et al. ............. | 369/116 |
| 6,621,778 B1 | * | 9/2003 | Lu et al. ......................... | 369/116 |
| 7,161,882 B2 | * | 1/2007 | Lehr et al. ..................... | 369/116 |

* cited by examiner

*Primary Examiner* — Wayne Young
*Assistant Examiner* — Brian Butcher
(74) *Attorney, Agent, or Firm* — Muncy, Geissler, Olds & Lowe, PLLC

(57) ABSTRACT

The present invention relates to methods for on-line calibrating output power of an optical pick-up. A power adjusting circuit of the optical pick-up has an optical power regulator and an optical power detector. The on-line output power calibrating method includes the steps of: performing a recording pre-process; providing a focus offset value and/or a tilt offset value to the optical pick-up; providing a setting value, corresponding to power under test, to the optical power regulator; detecting laser power emitted from the optical pick-up using the optical power detector; comparing the laser power with the power under test to adjust the setting value of the optical power regulator corresponding to the power under test; and performing an optimum power calibration if the laser power emitted from the optical pick-up conforms to the power under test.

16 Claims, 4 Drawing Sheets

(R disc)

(RW disc)

METHODS FOR ON-LINE CALIBRATING OUTPUT POWER OF OPTICAL PICK-UP

This application claims priority of No. 098100563 filed in Taiwan R.O.C. on Jan. 9, 2009 under 35 USC 119, the entire content of which is hereby incorporated by reference.

BACKGROUND OF THE INVENTION

1. Field of the Invention

The present invention relates to the technology of an optical storage medium, and more particularly, to an on-line output power calibrating method for making an optimum power calibration of an optical pick-up precise and increasing the stability of the optimum power calibration.

2. Related Art

In the present optical recording technology, an optimum power calibration (OPC) is usually performed before writing data into a disc in order to reduce failure of writing and make the written data more stable. By performing the optimum power calibration procedure, one set of optimum laser power suitable for writing data in this optical disc can be decided, such that the jitter value of the radio frequency (RF) data marked on the optical disc after writing or the decoding error rate can be effectively suppressed and the optimum writing quality can be achieved.

In the DVD format Book, the optimum power control procedure is defined according to a β method and a γ method. The β method is mainly applied to a one-time recordable optical disc, while the γ method is mainly applied to a rewritable optical disc. In these two methods, 15 stages of laser beams with different power are mainly utilized to perform the test writing on the optical disc to select the optimum write power. However, the optical pick-up ages with the elapse of used time, thereby causing the output power to become inaccurate, which deteriorates the optimum write power calibration result. In order to explain this phenomenon, illustrations will be made with reference to the circuit structure of the optical pick-up.

FIG. 1 shows the circuit architecture of a conventional optical pick-up. Referring to FIG. 1, the circuit includes a digital-to-analog converter 101, a laser pick-up diode driving circuit 102, a laser pick-up diode 103, a beam splitter 104, a focus lens 105, a front photo diode 106, an optical storage medium 107 and an eight-beam splitter diode 108. The laser pick-up diode driving circuit 102 has three analog input channels DG1 to DG3, each of which corresponds to the digital-to-analog converter 101 and one of enable inputs EN1 to EN3. Generally speaking, a power level outputted from the laser pick-up diode 103 is controlled according to input digital values DG1 to DG3 of the digital-to-analog converters 101, wherein DG1, DG2 and DG3 respectively correspond to P1, P2 and P3. In addition, the enable input signals EN1 to EN3 control the times when the laser pick-up diode 103 outputs the power (P1, P2, P3). Transfer functions between each of the channel inputs DG1 to DG3 to the laser power output have different weightings. Generally speaking, the power that can be controlled by the input digital value DG1 is higher, so its weighting is larger; the power that can be controlled by the input digital value DG2 is lower, so its weighting is smaller; and the main function of the input digital value DG3 is to cool the laser pick-up. Because the laser pick-up diode 103 cannot output too much power for a long time, it needs to be cooled for a period of time to prevent the laser pick-up diode 103 from burning out. Because the input digital value DG3 is less associated with the output power of the laser pick-up diode, discussions thereof will be omitted.

In the prior art, the input digital value DG1 corresponding to the analog input channel with the maximum weighting is under the close loop control. That is, the finally outputted power P1 of the laser pick-up diode 103 detected by the front photo diode 106 is fed back through the current IFPD measured by the front photo diode 106. The input digital value DG1 is adaptively adjusted according to this feedback mechanism such that the laser pick-up diode 103 outputs the predetermined target power. However, the input digital value DG2 corresponding to the analog input channel with the smaller weighting is under the open loop control. In other words, the digital value DG2 corresponding to the power P2 outputted therefrom is found according to a look-up table. Because the control mechanism of the output power P2 pertains to the open loop control, the manufacturer has to perform a ship-out calibration on this channel to create the look-up table of the output power P2 before the optical drive is shipped out.

Precisely speaking, the output power of the laser pick-up diode 103 is determined by adding the output power P1 to the output power P2. That is, the output power of the laser pick-up diode 103 is determined by the input digital values DG1 and DG2. For example, because the output power P1 is under the close loop control, the output power of the laser pick-up diode 103 may be precisely determined as 4 mW, 8 mW, 12 mW and 16 mW according to the input digital value DG1. However, when the output power has to reach 5 mW, the output power P1 makes the laser pick-up output 4 mW by the close loop control. Then, the digital value DG2 is looked up through the look-up table of the output power P2 and then outputted to the corresponding analog-to-digital converter 101.

However, with the aging of the laser pick-up diode 103 or the unstable power supplied from the computer to the recorder, the input digital value DG2 looked up from the look-up table of the output power P2 becomes inaccurate. For example, the original power to be outputted is 5 mW, the laser pick-up diode 103 only can output 4.3 mW according to the default input digital value DG2 because of the aging of the laser pick-up diode 103 or because of the unstable power. This condition makes the optimum power calibration (OPC) become inaccurate, thereby causing the poor writing quality or writing failure.

SUMMARY OF THE INVENTION

It is therefore an objective of the present invention to provide an on-line output power calibrating method capable of effectively enhancing the stability of the optimum power calibration and effectively solving the problem of generating different output properties when a system supply voltage is unstable without wasting the time.

The present invention achieves the above-identified or other objectives by providing an on-line output power calibrating method for adjusting laser power of an optical pick-up, wherein a power adjusting circuit of the optical pick-up having an optical power regulator and an optical power detector is provided. The optical power regulator regulates the laser power according to a default digital value. The on-line output power calibrating method includes the steps of: performing a recording pre-process; providing a focus offset value and/or a tilt offset value to the optical pick-up; providing a corresponding default digital value to the optical power regulator according to a predetermined power value; detecting the laser power, emitted from the optical pick-up, through the optical power detector; comparing the laser power, emitted from the optical pick-up, with the predetermined power value to find a difference therebetween and thus adjust a setting value of the optical power regulator corresponding to power under test;

and recovering a projection area of the optical pick-up on a disc and performing an optimum power calibration after the laser power, emitted from the optical pick-up, is judged as conforming to the power under test.

In the on-line output power calibrating method according to the preferred embodiment of the present invention, the optical power regulator includes a first analog channel regulator and a second analog channel regulator, and the first analog channel regulator has a close loop control structure. The abovementioned step of comparing the laser power, emitted from the optical pick-up, with the predetermined power value to find the difference and thus to adjust the setting value of the optical power regulator corresponding to the power under test includes the sub-steps of:

adjusting the first analog channel regulator by way of close loop control to make the optical pick-up output a first rated power;

providing a setting value corresponding to the power under test to the second analog channel regulator;

determining whether the power outputted from the optical pick-up is equal to a second rated power; and adjusting, if the power outputted from the optical pick-up is not equal to the second rated power, the setting value of the second analog channel regulator corresponding to the power under test, and returning to the step of determining whether the power outputted from the optical pick-up is equal to the second rated power until the power outputted from the optical pick-up is equal to the second rated power.

In the on-line output power calibrating method according to the preferred embodiment of the present invention, when the optical disc is a one-time writable optical disc, the first analog channel regulator regulates write power of the one-time writable optical disc, and the second analog channel regulator regulates the peak power of the one-time writable optical disc. When the optical disc is a rewritable optical disc, the first analog channel regulator regulates the erase power of the rewritable optical disc, and the second analog channel regulator regulates the write power of the rewritable optical disc.

The spirit of the present invention is to calibrate the on-line output power of the optical pick-up by adjusting the setting value of the optical power regulator corresponding to the power under test before the formal writing and after the front writing. Thus, when the laser pick-up diode ages or when the power is unstable, the power output value of each analog channel regulator may be timely adjusted so that the precise laser power may be outputted.

In a preferred embodiment, it is unnecessary to defocus the optical pick-up during calibration for increasing the calibration speed. Furthermore, a focus offset value and/or a tilt offset value may be provided to the optical pick-up such that the laser emitted from the optical pick-up can be projected onto the disc over a larger area to prevent the optical disc from being damaged. Therefore, the present invention may have the following features.

First, the stability and the precision of the optimum power calibration can be effectively enhanced.

Second, it is unnecessary to defocus and re-focus the optical pick-up, so the time for focusing can be shortened.

Third, when the system supply voltage is unstable, the offset of the output power property may be solved by the on-line output power calibrating method of the present invention.

Fourth, the problem of the aging of the optical pick-up may be solved.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

Figure 2A:
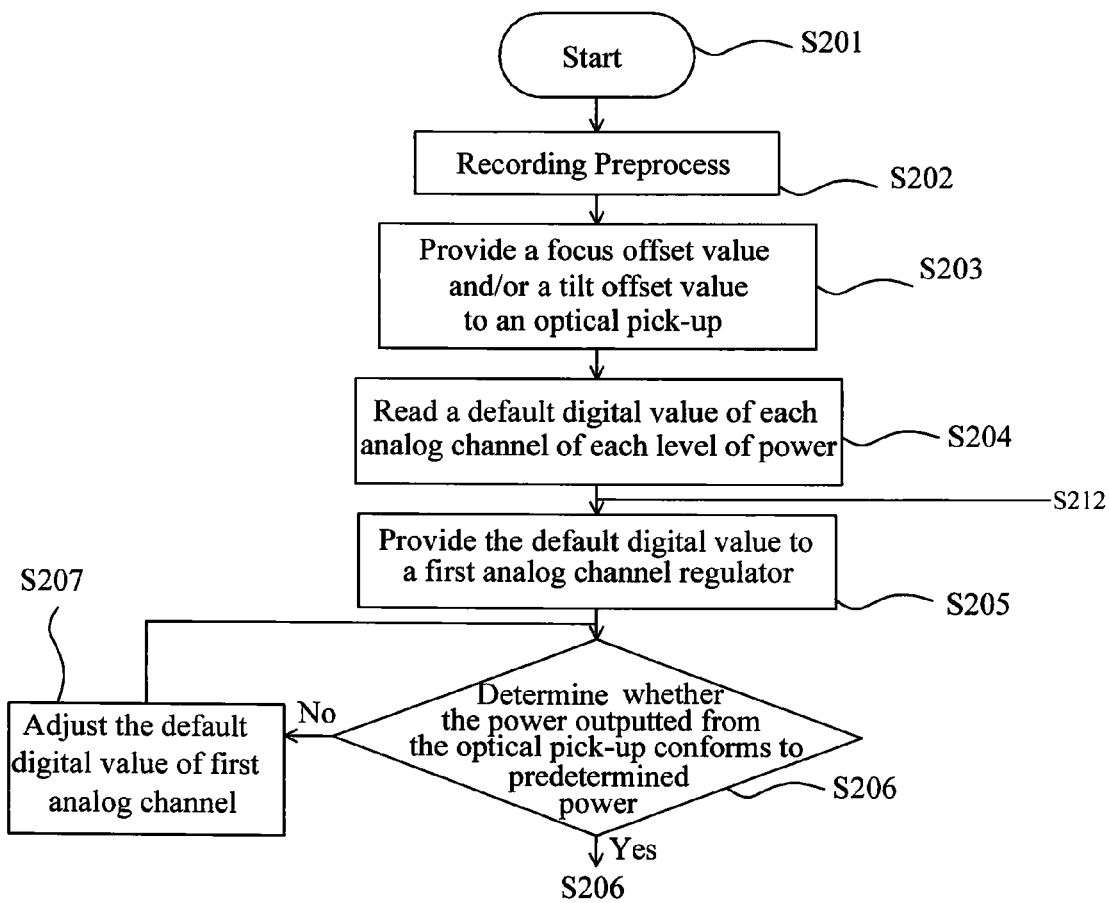
FIG. 2A and FIG. 2B are a flow chart showing an on-line output power calibrating method according to an embodiment of the present invention.
Figure 2B:
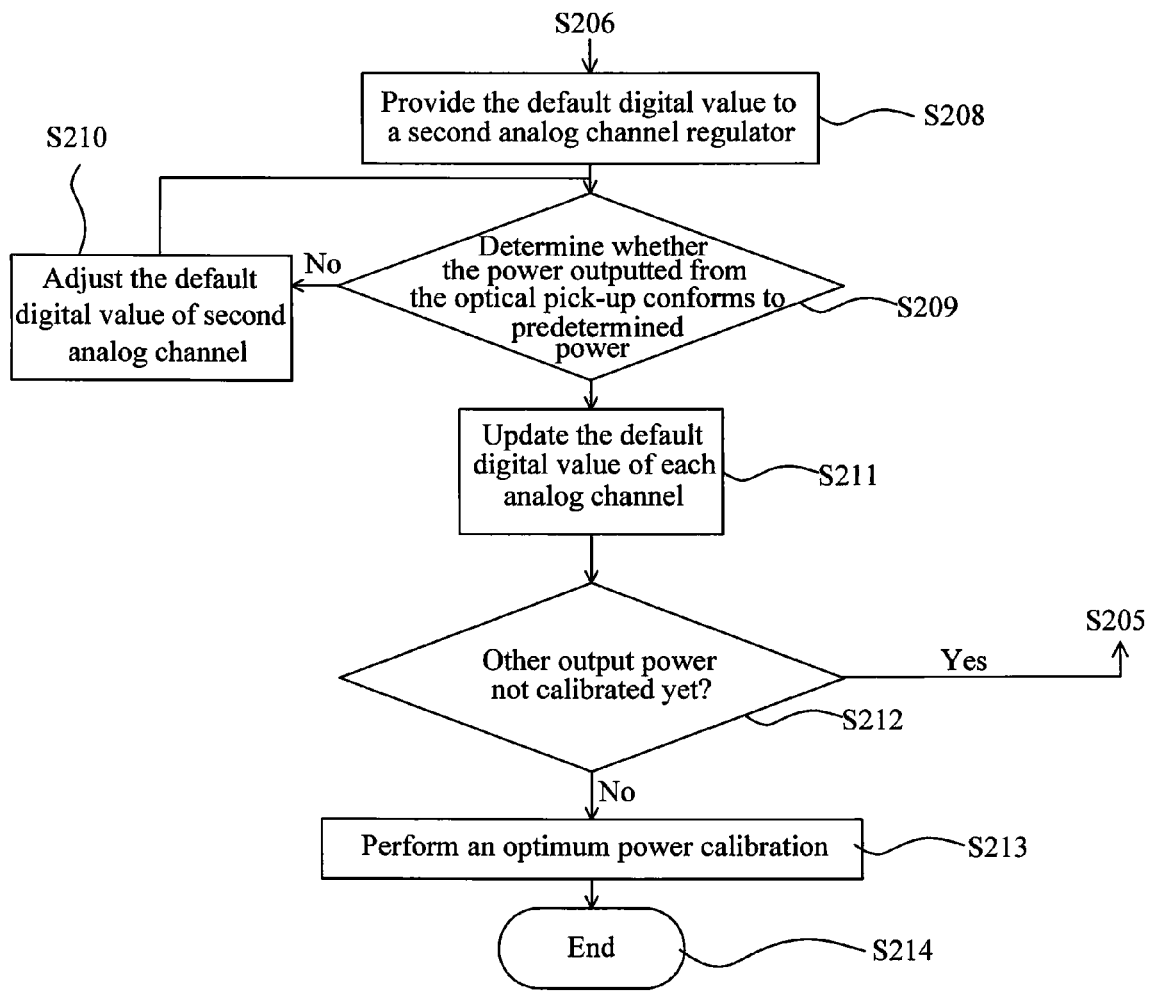

FIG. 2A and FIG. 2B are a flow chart showing an on-line output power calibrating method according to an embodiment of the present invention. As shown in FIG. 2A and FIG. 2B, before this method is described, it is assumed that the method is used to perform the power calibration before the optical disc is written. The on-line output power calibrating method includes the following steps.

In step S201, the method starts.

In step S202, a recording pre-process is performed. For example, the optical disc is focused or the tilt angle of an optical pick-up is calibrated to find a focus value or a tilt calibrating value.

In step S203, a focus offset value and/or a tilt offset value are/is provided to the optical pick-up. Because the focus value and the tilt calibrating value have been found in the previous step S202, the laser outputted from the optical pick-up cannot focus onto the optical disc if the focus offset value is applied to the optical pick-up. Similarly, if this tilt offset value is applied to the optical pick-up, the laser outputted from the optical pick-up cannot focus on the optical disc. The reason of providing the focus offset value and/or the tilt offset value is to form a larger area when the laser beam is projected onto the optical disc. So, the disc cannot be damaged (i.e., no pit or mark will be formed) even if the output power is too high. When the optimum power calibration (OPC) has to be performed, the optical pick-up can precisely focus on the optical disc only by eliminating the focus offset value and/or the tilt offset value. One of ordinary skill in the art should understand that the focus offset value or the tilt offset value of this step may have several alternatives according to different conditions or different designs.

First, only the focus offset value is provided.

Second, only the tilt offset value is provided.

Third, the focus offset value and the tilt offset value are simultaneously provided.

In step S204, a default digital value of each analog channel of each level of power is read. This step is to read out the default digital value of each analog channel in a look-up table, which is established when the optical drive is manufactured. The step S204 may be exchanged with the step S203. Alternatively, the default digital value of each analog channel of each level of power can be read in the step S202. The embodiment does not intend to limit the order of the steps. Of course, in another embodiment, other solutions, such as enlarging the projection area of the optical pick-up laser on the disc, may be adopted in the step S203. For example, the conventional defocus method may be adopted to prevent the power calibrating region from being damaged.

In step S205, the corresponding setting value (i.e., the setting value of the first analog channel corresponding to the power under test) is provided to the first analog channel regulator according to the power under test at each time. Alternatively, the corresponding setting value is the value that should be inputted to the first analog channel regulator when the optical pick-up is requested to output the power under test, and may be a default value or an updated default value. Herein, the power under test represents the output power of the optical pick-up to be measured.

In step S206, it is determined whether the power outputted from the optical pick-up conforms to a predetermined first rated power. When the result is "No", step S207 is performed. When the result is "Yes", step S208 is performed.

In the step S207, the predetermined first analog power is compared with the power outputted from the optical pick-up to adjust the setting value of the first analog channel. The system may determine the value that should be compensated with respect to the first analog channel in the step S207 according to the difference between the predetermined first rated power and the power outputted from the optical pick-up. Thereafter, the procedure goes back to the step S206 to again judge whether the power outputted from the optical pick-up conforms to the predetermined first rated power until the power outputted from the optical pick-up is equal to the predetermined first rated power. Then, the step S208 is performed.

Figure 3A:
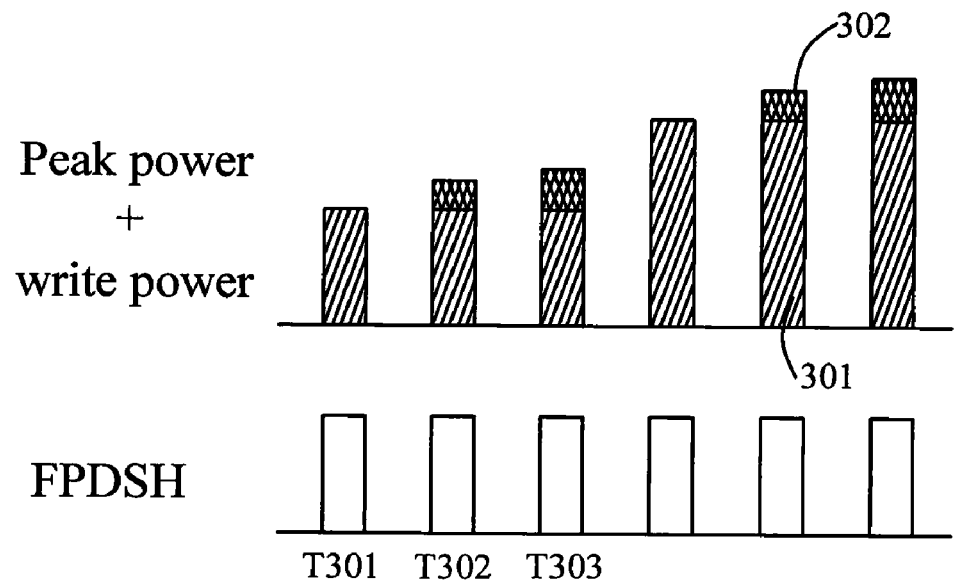
FIG. 3A is a schematic illustration showing the on-line output power calibrating method applied to a one-time writable optical disc according to the embodiment of the present invention.
Figure 3B:
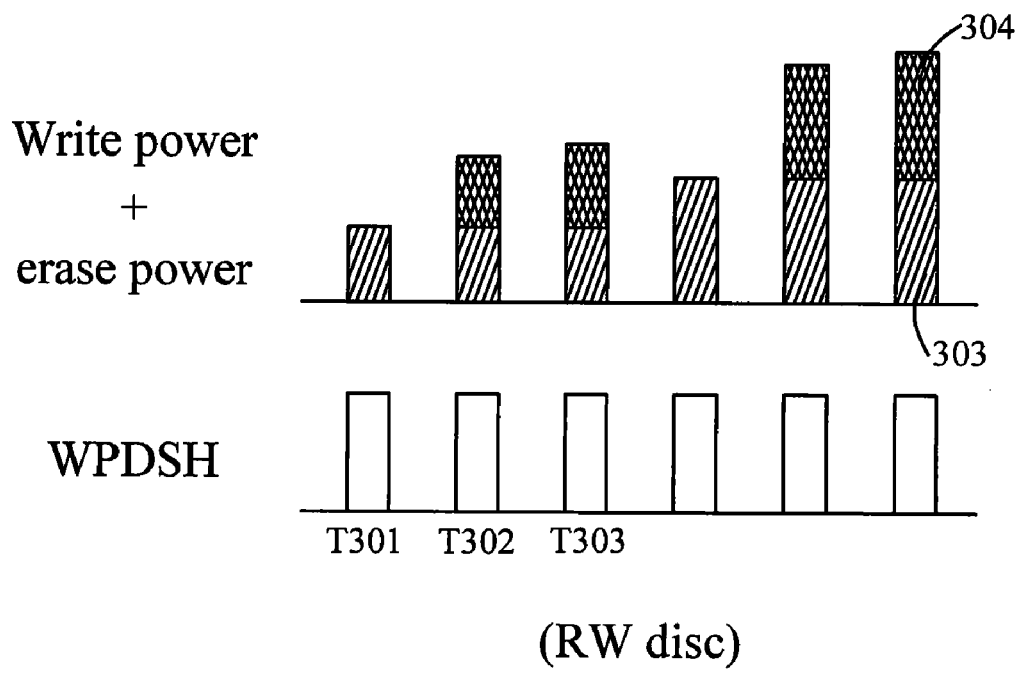
FIG. 3B is a schematic illustration showing the on-line output power calibrating method applied to a rewritable optical disc according to another embodiment of the present invention.

In the steps S205 to S207, the first analog channel regulator is adjusted by way of close loop control such that the laser beam outputted from the optical pick-up has the first rated power. FIGS. 3A and 3B are schematic illustrations showing on-line output power calibrating methods according to the embodiment of the present invention. Please refer to FIG. 3A and the circuit of FIG. 1 first. In FIG. 3A, the one-time writable optical disc (R disc) is described as an example. Herein, the digital-to-analog converter 101 for receiving the output digital value DG1 is defined as the first analog channel regulator, and the digital-to-analog converter 101 for receiving the output digital value DG2 is defined as the second analog channel regulator. In addition, the symbol FPDSH represents the front photo diode sample and hold signal. In this embodiment, when the signal has the high voltage, it represents that the output power outputted from the optical pick-up is sampled. Generally speaking, the write power, as shown in the parallel hatched portion 301, is determined according to the inputted digital value of the first analog channel regulator. The peak power, as shown in the crossed hatched portion 302, is determined according to the inputted digital value of the second analog channel regulator.

Figure 1:
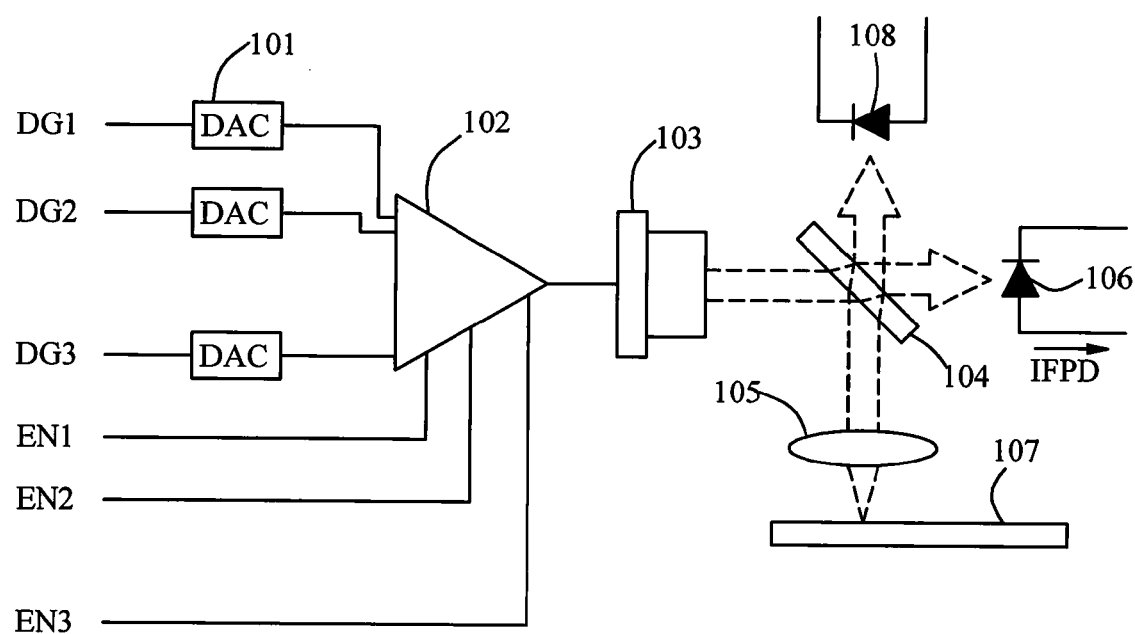
FIG. 1 shows the circuit architecture of a conventional optical pick-up.

Next, please refer to FIG. 3B and the circuit of the conventional FIG. 1, wherein a rewritable optical disc (RW disc) is illustrated as an example in FIG. 3B. Similarly, the digital-to-analog converter 101 for receiving the output digital value DG1 is defined as the first analog channel regulator, and the digital-to-analog converter 101 for receiving the output digital value DG2 is defined as the second analog channel regulator. In this embodiment, when the FPDSH signal has the high voltage, it represents that the output power outputted from the optical pick-up is sampled. The slight difference will be described in the following. When the disc is a rewritable optical disc, the erase power is determined according to the inputted digital value of the first analog channel regulator, as shown in the parallel hatched portion 303, and the write power is determined according to the inputted digital value of the second analog channel regulator, as shown in the crossed hatched portion 304. In other words, the actual power used to write the optical disc is equal to the erase power 303 plus the write power 304. Thus, it is obtained, from this drawing, that if the look-up table is not precise, the influence, caused by the aging of the optical pick-up or the unstable system power, on the writing of the rewritable optical disc is greater than that on the writing of the one-time writable optical disc.

In this embodiment, the steps S205 to S207 are performed in the time T301 of FIGS. 3A and 3B. In the design of the optical drive, the first analog channel regulator has the close loop circuit design. That is, the power outputted from the optical pick-up in the time T301 is adjusted to the more precise output power through the feedback control mechanism in the optical pick-up circuit.

In the step S208, the corresponding setting value is provided to the second analog channel according to the power under test, wherein the setting value may be a default value, an updated default value, or a value that should be inputted to the second analog channel regulator when the optical pick-up is requested to output the power under test. In this embodiment, the second analog channel regulator mainly determines the peak power (R disc) or the write power (RW disc). As shown in the power schematic illustrations corresponding to the time T302 of FIGS. 3A and 3B, the default digital value is usually read out from the look-up table of the firmware by performing the step S204, and has been defined when the product is manufactured. Consequently, the peak power (R disc) or the write power (RW disc) corresponding to the time T302 cannot be changed in the prior art.

In step S209, it is determined whether the power outputted from the optical pick-up conforms to the predetermined second rated power. In this embodiment, the power detection is performed in the time T302, and the detected power and the second rated power, which should be outputted originally, are compared in the step S209. When the result is "No", step S210 is performed. When the result is "Yes", step S211 is performed.

In the step S210, the setting value corresponding to the second analog channel regulator is adjusted, wherein the system may determine the value, which should be compensated to the second analog channel in the step S207, according to the difference between the predetermined second rated power and the power outputted from the optical pick-up. Thereafter, the procedure goes back to the previous step S209 until the power outputted from the optical pick-up is equal to the second rated power.

Please refer to the power schematic illustrations corresponding to the time T303 of FIGS. 3A and 3B. If the output power corresponding to the original default digital value is insufficient due to the aging of the optical pick-up, the output power is higher than the original power corresponding to the value by adjusting the setting value. In the conventional design of the optical pick-up, the second analog channel regulator does not have the close loop design. In other words, the power outputted from the optical pick-up in the time T302 cannot be adjusted by the feedback control mechanism of the optical pick-up circuit. Thus, it is obtained, from the timings T302 to T303 of FIGS. 3A and 3B, that performing the steps S208 to S210 to calibrate the peak power (R disc) or the write power (RW disc) needs to perform the sampling and adjusting procedures again and again. So, the spent time is relatively long.

In the step S211, the setting value of each analog channel corresponding to the power under test is updated, and the original setting value is replaced with the adjusted value so that it can be used in the next writing procedure.

In step S212, it is determined whether there is any output power, which has not been calibrated yet. When the result is "Yes", the other power is selected, and the procedure goes back to step S205 to perform the calibrating steps again. When the result is "No", step S213 is performed.

In the step S213, enlarging the projection area of the optical pick-up laser on the disc is to provide the focus offset value and/or the tilt offset value to the optical pick-up, and recovering the projection area of the optical pick-up laser on the disc is to eliminate the focus offset value and/or the tilt offset value. Enlarging the projection area of the optical pick-up laser on the disc is to defocus the optical pick-up, and recovering the projection area of the optical pick-up laser on the disc is to focus the optical pick-up. Then, the optimum power calibration is performed.

In step S214, the method ends.

One of ordinary skill in the art should understand that it is unnecessary to perform the steps of the embodiment during each writing procedure, and may create a detection mechanism for detecting the optical disc by designing the software or firmware to judge whether the above-mentioned steps have to be performed according to the quality of the optical disc. So, the present invention is not limited to the performing of the on-line output power calibrating method according to the embodiment of the invention before each writing procedure.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. An on-line output power calibrating method for adjusting laser power of an optical pick-up, wherein the optical pick-up comprises an optical power regulator and an optical power detector, the on-line output power calibrating method comprising the steps of:
    performing a recording pre-process;
    providing a focus offset value and/or a tilt offset value to the optical pick-up;
    performing a close loop output power calibration;
    performing an open loop output power calibration, comprising:
        providing a setting value corresponding to power under test to the optical power regulator according to the power under test, wherein the setting value is read from a look-up table according to the power under test;
        using the optical power detector to detect the laser power emitted from the optical pick-up;
        comparing the laser power with the power under test to adjust the setting value of the optical power regulator corresponding to the power under test;
        determining whether the laser power emitted from the optical pick-up conforms to the power under test; and
        updating the setting value in the look-up table when the laser power emitted from the optical pick-up conforms to the power under test; and
    performing an optimum power calibration according to the updated setting value;
    wherein all of the above-mentioned steps of the on-line output power calibrating method are performed on-line when a recorder is configured by a user to perform a recording process, and
    wherein the close loop output power calibration is different from the open loop output power calibration.

2. The method according to claim 1, wherein the optical power regulator comprises a first analog channel regulator and a second analog channel regulator, the first analog channel regulator has a close loop control structure, and the step of comparing the laser power, emitted from the optical pick-up, with the power under test to adjust the setting value of the optical power regulator corresponding to the power under test comprises:
    adjusting the first analog channel regulator by way of close loop control to make the optical pick-up output first rated power;
    providing a setting value corresponding to the power under test to the second analog channel regulator;
    determining whether the power outputted from the optical pick-up is equal to a second rated power; and
    adjusting, if the power outputted from the optical pick-up is not equal to the second rated power, the setting value of the second analog channel regulator corresponding to the power under test according to a difference between the second rated power and the power outputted from the optical pick-up, and returning to the step of determining whether the power outputted from the optical pick-up is equal to the second rated power until the power outputted from the optical pick-up is equal to the second rated power.

3. The method according to claim 2, wherein the first analog channel regulator regulates write power of an one-time writable optical disc, while the second analog channel regulator regulates peak power of the one-time writable optical disc.

4. The method according to claim 2, wherein the first analog channel regulator regulates erase power of an rewritable optical disc, while the second analog channel regulator regulates write power of the rewritable optical disc.

5. The method according to claim 1, wherein the setting value of the optical power regulator corresponding to the power under test corresponds to a default value of the power under test and an updated default value.

6. The method according to claim 1, further comprising:
    updating the setting value of the optical power regulator corresponding to the power under test with an adjusted setting value after the laser power emitted from the optical pick-up is determined to be equal to the power under test.

7. The method according to claim 1, wherein the optical pick-up comprises a look-up table for storing the setting values corresponding to the optical power regulator and the power under test, the method further comprising:
    updating the look-up table according to the setting value of the optical power regulator corresponding to the power under test after the laser power emitted from the optical pick-up is determined as conforming to the power under test, wherein the setting value of the optical power regulator corresponding to the power under test is read out in the step of performing the recording pre-process, after the step of performing the recording pre-process and before the step of providing the focus offset value and/or the tilt offset value to the optical pick-up, or after the step of providing the focus offset value and/or the tilt offset value to the optical pick-up.

8. An on-line output power calibrating method for adjusting laser power of an optical pick-up, wherein the optical pick-up comprises an optical power regulator and an optical power detector, the method comprising:

performing a recording pre-process;

enlarging a projection area of an optical pick-up laser on a disc;

performing a close loop output power calibration;

performing an open loop output power calibration, comprising:
- providing a setting value corresponding to a power under test to the optical power regulator according to the power under test, wherein the setting value is read from a look-up table according to the power under test;
- detecting the laser power emitted from the optical pick-up using the optical power detector;
- comparing the laser power, emitted from the optical pick-up, with the power under test to adjust the setting value of the optical power regulator corresponding to the power under test; and
- updating the setting value in the look-up table when the laser power emitted from the optical pick-up conforms to the power under test;

recovering the projection area of the optical pick-up laser on the disc after determining the laser power emitted from the optical pick-up as being equal to the power under test; and performing an optimum power calibration according to the updated setting value;

wherein all of the above-mentioned steps of the on-line output power calibrating method are performed on-line when a recorder is configured by a user to perform a recording process, and wherein the close loop output power calibration is different from the open loop output power calibration.

9. The method according to claim 8, wherein the optical power regulator comprises a first analog channel regulator and a second analog channel regulator, the first analog channel regulator has a close loop control structure, and the step of comparing the laser power, emitted from the optical pick-up, with the power under test to adjust the setting value of the optical power regulator corresponding to the power under test comprises:

adjusting the first analog channel regulator by way of close loop control to make the optical pick-up output first rated power;

providing the setting value corresponding to the power under test to the second analog channel regulator;

determining whether power outputted from the optical pick-up is equal to a second rated power; and adjusting, if the power outputted from the optical pick-up is not equal to the second rated power, the setting value of the second analog channel regulator corresponding to the power under test according to a difference between the second rated power and the power outputted from the optical pick-up, and returning to the step of determining whether the power outputted from the optical pick-up is equal to the second rated power until the power outputted from the optical pick-up is equal to the second rated power.

10. The method according to claim 9, wherein the first analog channel regulator regulates write power of an one-time writable optical disc, while the second analog channel regulator regulates peak power of the one-time writable optical disc.

11. The method according to claim 9, wherein the first analog channel regulator regulates erase power of an rewritable optical disc, while the second analog channel regulator regulates write power of the rewritable optical disc.

12. The method according to claim 9, wherein the setting value of the optical power regulator corresponding to the power under test corresponds to a default value of the power under test and an updated default value.

13. The method according to claim 8, further comprising:
updating the setting value of the optical power regulator corresponding to the power under test with an adjusted setting value after the laser power emitted from the optical pick-up is judged to be equal to the power under test.

14. The method according to claim 8, wherein the optical pick-up comprises a look-up table for storing the setting values corresponding to the optical power regulator and the power under test, the method further comprising:

updating the look-up table according to the setting value of the optical power regulator corresponding to the power under test after the laser power emitted from the optical pick-up is determined as conforming to the power under test; and the setting value of the optical power regulator corresponding to the power under test is read out in the step of performing the recording pre-process, after the step of performing the recording pre-process and before the step of providing a focus offset value and/or a tilt offset value to the optical pick-up, or after the step of providing the focus offset value and/or the tilt offset value to the optical pick-up.

15. The method according to claim 8, wherein the step of enlarging the projection area of the optical pick-up laser on the disc is to provide a focus offset value and/or a tilt offset value to the optical pick-up, and the step of recovering the projection area of the optical pick-up laser on the disc is to eliminate the focus offset value and/or the tilt offset value.

16. The method according to claim 8, wherein the step of enlarging the projection area of the optical pick-up laser on the disc is to defocus the optical pick-up, and the step of recovering the projection area of the optical pick-up laser on the disc is to focus the optical pick-up.

* * * * *